United States Patent

Ettre et al.

[15] 3,655,496

[45] Apr. 11, 1972

[54] TAPE TRANSFER OF SINTERABLE CONDUCTIVE, SEMICONDUCTIVE OR INSULATING PATTERNS TO ELECTRONIC COMPONENT SUBSTRATES

[72] Inventors: Kitty S. Ettre, Norwalk; George Richard Castles, Stamford, both of Conn.

[73] Assignee: Vitta Corporation, Wilton, Conn.

[22] Filed: Sept. 25, 1969

[21] Appl. No.: 860,866

[52] U.S. Cl. ....................161/39, 29/423, 156/89, 156/155, 161/406, 206/56 A, 206/65 F

[51] Int. Cl. ....................B32b 7/04

[58] Field of Search ..............161/406, 39; 29/423, 424, 589, 29/590; 156/155, 89, 230, 344; 65/23; 206/56 A, 65 F

[56] References Cited

UNITED STATES PATENTS

| | | | |
|---|---|---|---|
| 2,629,670 | 2/1953 | Rathke | 156/155 X |
| 3,497,948 | 3/1970 | Wiesler | 53/21 X |
| 2,111,897 | 3/1938 | McNutt | 156/155 X |
| 3,487,603 | 1/1970 | Roberts | 206/46 X |
| 3,035,690 | 5/1962 | Frohbach | 161/406 X |
| 3,335,852 | 8/1967 | Soma | 206/56 A |

*Primary Examiner*—John T. Goolkasian
*Assistant Examiner*—Joseph C. Gile
*Attorney*—Blair, Cesari and St. Onge

[57] ABSTRACT

Conductive, semiconductive or insulating patterns such as fine line, thick film circuitry, or dot configurations are applied to electronic component substrates from a continuous transfer tape. In the transfer tape the patterns are formed with prearranged spacing on a heat decomposable carrier film, which in turn is supported on a backing strip and covered by a protective strip. In use the protective strip is peeled off and the patterns, still adhered to the carrier film and supported by the backing strip, are adhesively secured to a group or a continuously fed series of pre-aligned substrates. The backing strip is then peeled off, and the substrates with the applied patterns, now supported only by the heat decomposable carrier film, are placed in an oven for sintering and decomposition of the carrier film. The transfer tape and method of the invention lend themselves readily to automated, production-line procedures.

6 Claims, 3 Drawing Figures

INVENTORS.
Kitty S. Eltre
BY George Richard Castles

Blair, Cesari & St. Onge
ATTORNEYS.

TAPE TRANSFER OF SINTERABLE CONDUCTIVE, SEMICONDUCTIVE OR INSULATING PATTERNS TO ELECTRONIC COMPONENT SUBSTRATES

BACKGROUND OF THE INVENTION

With the advent of miniaturized and microelectronic components, it has become increasingly more important for components manufacturers to be able to quickly and accurately apply relatively small and fragile conductive, semiconductive or insulating patterns onto various substrates. For example, thick film, thin line conductive patterns are frequently applied onto or around semiconductor chips in the production of integrated or hybrid circuitry, and similar fine line conductive patterns are applied to non-conductive substrates in the production of microminiaturized circuit boards.

In all these applications it is important that the pattern be transferred intact, that is without any gaps or breaks which may cause electrical discontinuity. Equally important is that the methods for transferring the patterns be adaptable to automated, production-line procedures so that commercially competitive products can be produced.

In the past, there have been many methods used for the direct application or transfer to substrates of patterns of the type under discussion; these methods include vacuum deposition, sputtering, anodization, silk screening, vapor plating and the like; However, problems are encountered with each of these methods. For example, patterns produced directly on substrates which are not entirely smooth by vacuum deposition have often exhibited defects. Where silk screening has been employed, difficulty has been encountered because any roughness in the substrate surface often projects through and causes discontinuities to occur in the transferred pattern. Moreover, silk screened patterns often required a pre-drying step before sintering. Further, many of the previously employed techniques are only applicable to single unit or batch processing methods, and cannot be satisfactorily used in continuous, automated, production-line processing.

Accordingly, representative objects of the present invention are to provide a method and transfer tape structure for the application to electronic substrates of sinterable conductive, semiconductive and insulating patterns, intact and in registration therewith; and to provide such a method and tape structure which are efficient, economical and effective, and which allow for continuous, automated, production-line processing.

Other objects of the invention will in part be obvious and will in part appear hereinafter.

The invention accordingly comprises the several steps and the relation of one or more of such steps with respect to each of the others, and the apparatus embodying features of construction, combinations of elements and arrangement of parts which are adapted to effect such steps, all as exemplified in the following detailed disclosure, and the scope of the invention will be indicated in the claims.

SUMMARY OF THE INVENTION

The present invention relates to the application of sinterable conductive, semiconductive or insulating patterns to electronic substrates, and more particularly to a method and transfer tape for applying a plurality of such patterns intact and in registration with a plurality of corresponding substrates.

The transfer tape comprises a carrier film of a material which is heat decomposable at or below the sintering temperatures employed in the method. To one surface of the carrier film there are applied a plurality of adhering patterns of conductive, semi-conductive or insulating material depending on the electrical component being manufactured. The patterns may, for example, consist of intricate, fine line configurations as with thick film circuitry; alternatively, the patterns may comprise single or multiple dots which serve as lands for the connection of conductors, or as pads for bonding each substrate to other component parts.

The carrier film serves two principal functions. For one it provides a base layer upon which the patterns can be formed with prearranged spacing corresponding to the spacing required upon transfer to corresponding substrates. Also, the carrier film serves to support each pattern during handling of the transfer tape and upon transfer to the substrates; by providing support the carrier serves to prevent the patterns, be they fine line configurations or dots, from rupturing, separating or wrinkling during handling with resultant loss of conductive or insulating continuity. The carrier film is heat decomposable and remains attached to the patterns until sintering is effected, at which time it decomposes without harmful wastes. Thus, the relatively delicate patterns are not physically removed from the carrier film during processing which eliminates the principal operation in which pattern damage is likely to occur.

The exposed surfaces of the patterns on the carrier film are preferably coated with adhesive, most preferably a pressure sensitive adhesive, so that the patterns can readily be temporarily adhered to their respective substrates prior to sintering. The adhesively coated surface is also preferably covered with a protective strip, particularly where pressure sensitive adhesive is used. Further, the entire transfer tape structure is preferably supported on a backing strip lightly adhered to the surface of the carrier film opposite the patterns. The backing strip serves to support and protect the relatively fragile carrier film during manufacture and storage, and upon handling during application of the patterns.

The transfer tape may be used in batch processing operations in which case it may be applied by hand to a plurality of pre-aligned substrates. Preferably, however, it is used in an automated process in which a continuous strip of transfer tape is fed to pre-aligned substrates carried on a conveyor. In either application the protective strip is first peeled off the adhesively coated surface of the patterns, and the patterns with the carrier film and backing strip are temporarily adhered to the substrates by pressing or rolling. The prearranged spacing of the patterns on the tape insures that they will be properly spaced upon transfer to the corresponding substrates, and permits continuous, production-line processing by eliminating the need for individual manual alignment of each pattern and substrate.

After the patterns have been adhered to the corresponding substrates, the backing strip is peeled off the assembly leaving the patterns supported on the substrates solely by the carrier film. The substrates are then sintered to bond the patterns permanently thereto and also to decompose the carrier film, completing the transfer process.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DESCRIPTION OF THE PREFERRED EMBODIMENTS

Figures 1, 2:
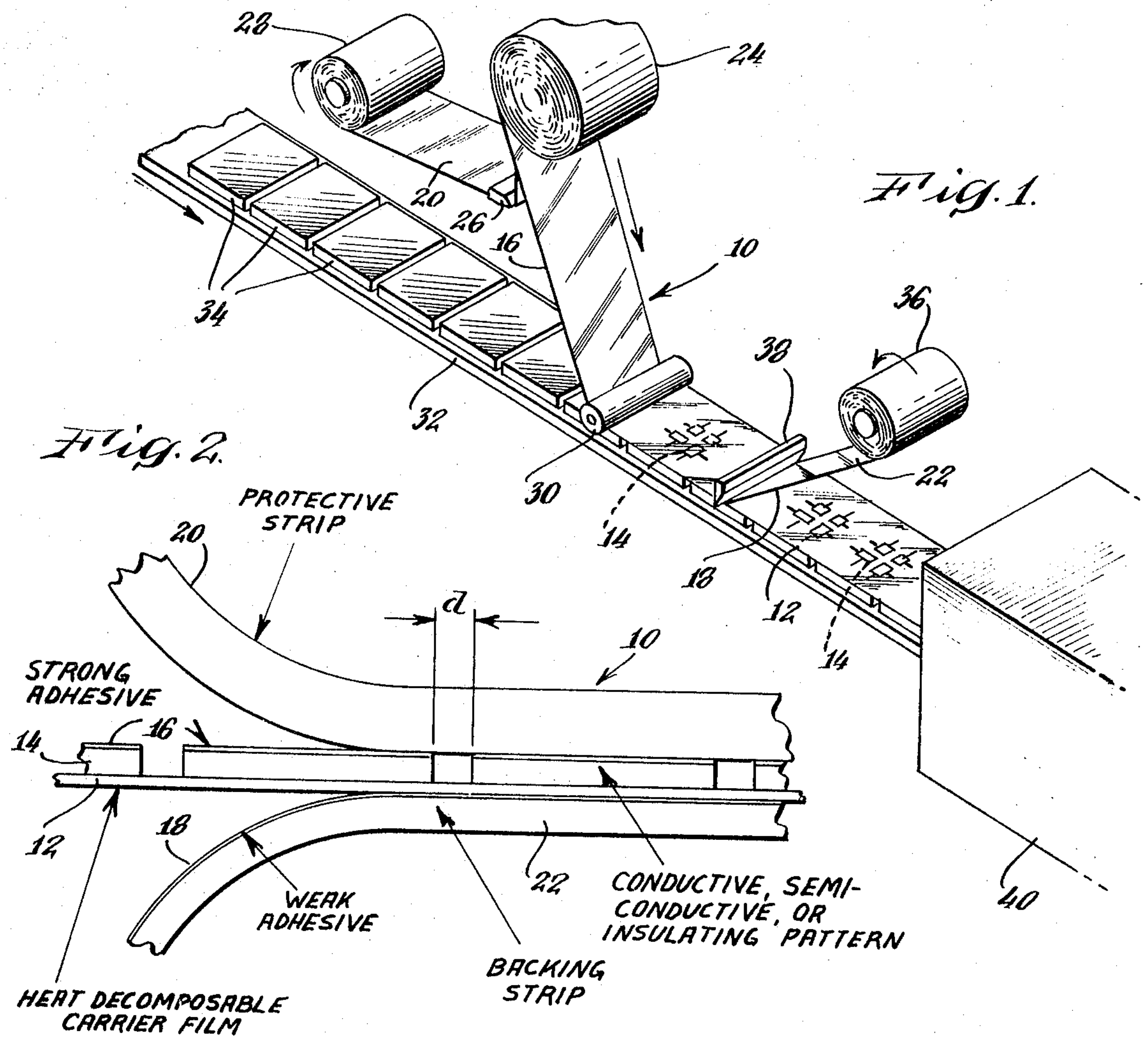
FIG. 1 is a schematic isometric view of the transfer tape of the invention as used in an automated, production-line process.
FIG. 2 is an enlarged, partial cross-sectional view of the transfer tape structure showing the protective strip and backing strip partly peeled back.

Referring now to FIG. 2, the transfer tape 10 comprises a heat decomposable carrier film 12 which serves two principal functions; it forms a base upon which the conductive, semiconductive or insulating patterns 14 may be formed with prearranged spacing, and serves as a support to maintain patterns 14 intact and in their prearranged spacing during and after their transfer to a substrate and into the sintering process. Carrier film 12 is preferably a very thin organic film, and one which will decompose completely at or below the sintering temperature used to permanently bond patterns 14 to a substrate without leaving residual carbon or damaging the patterns.

We have found that glycol terephthalic acid polyester film (available commercially as Mylar), polyethylene film, and cellulose acetate film, in thicknesses within the range of about 0.00005 inch to about 0.001 inch but more preferably below about 0.0005 inch, make very suitable heat decomposable carrier layers for the purposes of the invention. A particularly suitable carrier film 12 is provided with Mylar film of about 0.0001 inch in thickness. All of the above-mentioned film materials possess the requisite characteristics of being sufficiently strong to support the patterns formed thereon, and of being decomposable at the sintering temperature of the patterns without formation of harmful residual products and without pattern damage.

Patterns 14 are formed of conductive, semiconductive or insulating materials depending upon the type of electrical component being manufactured. Thus, the patterns may comprise fine line, thick film circuitry where the electrical component is, for example, an integrated or hybrid circuit device. As an example, fine line patterns having three mil wide lines separated by 3 mil spacings may be readily transferred in accordance with the invention. Alternatively the patterns may comprise single or multiple conductive, semiconductive or insulating dots or lands, or arrays thereof used for the attachment of leads, or for bonding to other electric components, or for insulating one component from another.

Patterns 14 may be formed from metals, metal oxides, glass or ceramic materials, or from combinations of two or more such inorganic materials; they may be applied to carrier film 12 by any of a number of photographic, deposition, printing and/or plating processes which will be apparent to those skilled in the art. Since the patterns are first applied to the extremely smooth and uniform carrier film 12 of the transfer tape structure, the problems of non-uniformity and disruption of pattern integrity, as experienced with prior art processes in which the patterns were applied directly to a substrate, are eliminated. Also, the flexibility of carrier film 12 allows it to conform upon transfer to any surface irregularities of the substrate while maintaining backing support for the patterns.

One suitable method of pattern formation is silk screen printing which produces patterns having a thickness preferably between about 5 microns to about 5 mils. For purposes of silk screening, the inorganic pattern materials are preferably provided in particle sizes of less than about 3 microns and most preferably less than about 1 micron; these particulate materials are then suspended in an organic binder to make them adaptable for use in the silk screening process.

The following are examples of some typical compositions which can be used for the formation of patterns 14 by silk screening:

EXAMPLE I

Molybdenum-Manganese (sintering temperature - 1500°C.)

| | |
|---|---|
| inorganic content (**80%**) | **75–85%** molybdenum powder |
| | **15–25%** manganese powder |
| organic content (**20%**) | **5–15%** ethylcellulose |
| | **85–95%** butylcarbitol |

EXAMPLE II

Silver-Glass Cermet (sintering temperature - 600°C.)

| | |
|---|---|
| inorganic content (**75%**) | **60–70%** silver powder |
| | **30–40%** lead-borosilicate glass |
| organic content (**25%**) | **0–10%** Acryloid **10** |
| | **45–55%** toluene |
| | **40–50%** amylacetate |

EXAMPLE III

| | |
|---|---|
| Gold-Glass Cermet (sintering temperature 850°C.) | |
| inorganic content (**85%**) | **77–87%** gold flakes |
| | **5–15%** $Bi_2O_3$ |
| | **3—13%** lead-borosilicate glass |
| organic content (**15%**) | **10–20%** ethyl cellulose |
| | **45–55%** diethylene glycol monobutyl butyl ether acetate |
| | **30–40%** amylacetate |

Figure 3:
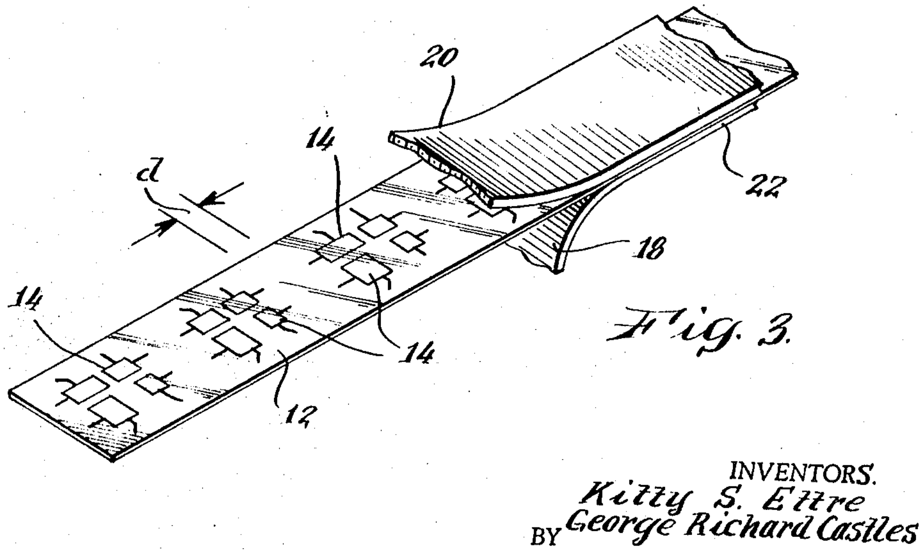
FIG. 3 is a top isometric view of the transfer tape shown in FIG. 2.

As shown in FIGURES 2 and 3, patterns 14 are formed on carrier film 12 with a prearranged spacing "*d*" which corresponds with the spacing required upon transfer of the patterns to corresponding substrates. This eliminates the need for the manual positioning of each pattern when they are applied to correspondingly aligned substrates and, as is more fully described hereinafter, permits the use of the transfer tape in an automated process. While transfer tape 10 has been shown with but a single line of spaced, transferable patterns 14, it will be understood that the invention also contemplates the provision of multiple lines of patterns 14 on carrier film 12. Such a multiple line transfer tape may be used where more than one pattern is to be transferred to each substrate, or when transfer of the patterns is to be simultaneously made to multiple, adjacently aligned substrates.

The exposed surfaces of the patterns 14 on carrier film 12 are preferably provided with a coating 16 of adhesive, so that each pattern can be temporarily adhered to its corresponding substrate during the transfer process. Adhesive coating 16 is preferably of the pressure sensitive variety so that adhesion can be effected by mere application of pressure and without the necessity for solvents, heat or the like. It will be understood, however, that alternatively, the adhesive may be applied directly to the substrate or to both the substrate and the exposed surface of each pattern. Adhesive layer 16 should be a relatively high strength adhesive and may be prepared with any thermoplastic synthetic resin base such as vinyl, cellulose or acrylic; the resin content should be sufficiently high to produce a high tack, high strength adhesive. Preferably, the ratio of tack between strong adhesive layer 16 and the weak adhesive layer 18 which is described more fully hereinafter, should be between about 10:1 and 5:1.

Preferably, and particularly where adhesive layer 16 is of the pressure sensitive variety, a protective strip 20 covers the adhesively coated surfaces of patterns 14 to prevent accidental adhesion and contamination prior to use. Protective strip 20 may be formed from any release coated paper generally used for protecting adhesive layers.

The transfer tape structure is supported on a backing strip 22 which is preferably formed from a relatively thick, non-stretchable organic film such as Mylar. However, other similar supporting materials such as Tedlar, polyethylene, cellulose acetate and even paper can be used. The thickness of backing strip 22 should preferably range between about 1 and 5 mils. We have found for example that a 2 mil thick Mylar film provides a very suitable backing strip material for the purposes of the invention.

Backing strip 22 is adhered to carrier film 12 on the surface opposite that on which patterns 14 are formed. With some carrier films there may be sufficient tack to adhere it to backing strip 22 without an intermediate adhesive. However a low-strength adhesive layer 18 is preferably provided on backing strip 22 for the required adhesion, and to allow the stripping off of backing strip 22 with relative case. Adhesive layer 18 is preferably prepared from a thermoplastic synthetic resin base such as vinyl, cellulose or acrylic, and has a low-resin content which results in a low-tack, weak adhesive. However, any type of adhesive material resulting in a weak bond can be used for adhesive layer 18.

In use, transfer tape 10 may be employed in a batch processing operation. In such case a plurality of substrates are aligned and spaced to correspond with the spacing between patterns 14. Protective strip 20 is then peeled from transfer tape 10 exposing the adhesive surface 16 of each pattern. The operator then aligns one pattern 14 with its adhesive surface 16 facing downwardly over the appropriate portion of the corresponding substrate, and presses that pattern 14 against the substrate to effect a temporary bond. Once one pattern has been aligned, the remaining patterns will be aligned with their corresponding substrates due to the precise spacing provided on the transfer tape. The remaining patterns may then be temporarily secured to their corresponding substrates by running a roller or the operator's finger up and down the transfer tape 10 against backing strip 22 and pressing the patterns against the substrates. Once all patterns 14 have been temporarily adhered to their corresponding substrates, backing strip 22 is peeled off leaving the patterns supported and maintained in spaced alignment by carrier film 12.

Carrier film 12 then serves to keep the substrates connected together so that they may readily be transferred as a unit to a sintering oven. Once in the sintering oven, the temperature is slowly raised to the level required to sinter each pattern 14 permanently to its corresponding substrate. Carrier film 12, because of its heat decomposable nature, will at the same time decompose completely having served its function of aligning and supporting patterns 14 prior to sintering. A typical sintering cycle will start off at a maximum temperature of 200° C. and slowly rise to the sintering temperature. Preferably, carrier film 12 is completely decomposed by the time the temperature reaches 300° C.

Most preferably, however, transfer tape 10 is used in an automated process in order to achieve a maximum rate of production with maximum efficiency and economy. Referring to FIG. 1, there is shown a schematic automated process using the transfer tape. Transfer tape 10 is continuously fed from a supply roll 24 across a first stripper bar 26 which acts in conjunction with a first stripper roll 28 to peel off protective strip 20. Tape 10 with its high strength adhesive layer 16 now exposed is then fed under a pressure roller 30.

Pressure roller 30 is positioned over a conveyor 32 which carries substrates 34 thereunder in a direction normal to the axis of roller 30. Substrates 34 are pre-aligned to correspond to the spacing of the patterns on tape 10. Roller 30 acts to press tape 10 continuously onto each substrate 34 as it passes thereunder, and each pattern is temporarily adhered in register with its corresponding substrate by the high-strength adhesive layer thereon. Backing strip 22 is then continuously peeled off by a second stripper roll 36 acting in conjunction with a second stripper bar 38.

The removal of backing strip 22 leaves the patterns 14 supported on substrates 34 only by carrier film 12 which also serves to hold substrates 34 firmly together for further processing. The substrates with the patterns adhered thereto may then be fed directly into a furnace 40 for sintering in the manner previously described.

It will thus be seen that the objects set forth above, among those made apparent from the preceding description, are efficiently attained and, since certain changes may be made in carrying out the above method and in the constructions set forth without departing from the scope of the invention, it is intended that all matter contained in the above description or shown in the accompanying drawings shall be interpreted as illustrative and not in a limiting sense.

Having described our invention, what we claim as new and desire to secure by Letters Patent is:

1. A transfer tape for applying sinterable, conductive, semiconductive or insulating patterns intact and in register to electronic component substrates comprising, in combination:

A. a strip of heat decomposable carrier film having a decomposition temperature at or below the sintering temperature of said patterns and a thickness in the range of about 0.00005 inch to about 0.001 inch, B. a plurality of conductive, semiconductive or insulating patterns adhered to one surface of said carrier film, said patterns being spaced on said carrier film in a prearranged manner to correspond to the spacing desired on said substrates, C. a coating of pressure sensitive adhesive on the exposed surfaces of said patterns for temporarily securing same to said substrates prior to sintering, and D. a backing strip lightly adhered to said carrier film on the surface thereof opposite said patterns.

2. A transfer tape as defined in claim 1 including a protective strip covering said pressure sensitive adhesive on the exposed surfaces of said patterns.

3. A transfer tape as defined in claim 1 wherein said patterns are arranged on said carrier film in multiple lines, whereby multiple transfer of said patterns may be simultaneously made to one or more corresponding substrates.

4. A transfer tape as defined in claim 1 wherein said carrier film is selected from the group consisting of glycol terephthalic acid polyester, cellulose acetate and polyethylene.

5. A transfer tape as defined in claim 4 wherein said carrier film has a thickness in the range of about 0.00005 inch to about 0.0005 inch.

6. A transfer tape as defined in claim 1 wherein said carrier film comprises glycol terephthalic acid polyester film having a thickness of about 0.0001 inch.

* * * * *